United States Patent [19]

Weathers et al.

[11] Patent Number: 5,047,767
[45] Date of Patent: Sep. 10, 1991

[54] APPARATUS UTILIZING A FOUR STATE ENCODER FOR ENCODING AND DECODING A SLIDING BLOCK (1,7) CODE

[75] Inventors: Anthony D. Weathers, San Diego; Robert D. Swanson, Del Mar, both of Calif.

[73] Assignee: Eastman Kodak Company, Rochester, N.Y.

[21] Appl. No.: 526,929

[22] Filed: May 21, 1990

[51] Int. Cl.⁵ .............................................. H03M 7/00
[52] U.S. Cl. ........................................ 341/59; 360/39
[58] Field of Search ...................... 341/59; 360/39, 40

[56]  References Cited

U.S. PATENT DOCUMENTS

| | | | |
|---|---|---|---|
| 4,413,251 | 11/1983 | Adler et al. | 341/59 |
| 4,488,142 | 12/1984 | Franaszek | 341/59 |
| 4,684,921 | 8/1987 | Fok et al. | 341/59 |
| 4,688,016 | 8/1987 | Fok | 341/59 |

*Primary Examiner*—Todd E. Deboer
*Assistant Examiner*—Marc. S. Hoff

*Attorney, Agent, or Firm*—Dennis P. Monteith

[57] ABSTRACT

The present invention comprises the hardware implementation of an algorithm for a run length limited (1,7) block code of rate ⅔, wherein 2 unconstrained bits are mapped onto 3 constrained bits. The encoded data stream has a minimum of 1 "zero" between adjacent "ones", and a maximum of seven "zeros" between adjacent "ones". Unlike earlier (1,7) block encoders, the encoder of the present invention is a 4 state machine whose internal state description requires only 2 bits, rather than the 3 bits as taught in the prior art. The 4 state encoder combines the 2 incoming data bits with present state information to generate the output encoded sequence, and the next state designation. Error propagation due to a single channel bit error is limited to 5 bits.

The decoder of the invention utilizes three, 3 bit shift registers which hold 9 bits of the encoded data; each group of three bits is decoded into 2 bits corresponding to the original input bits by means of a logic array fed from the three shift registers.

2 Claims, 6 Drawing Sheets

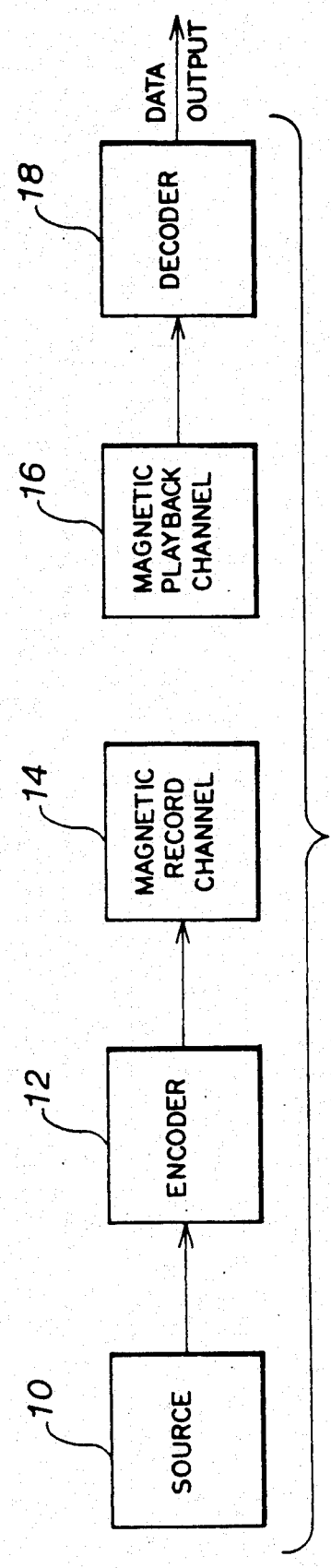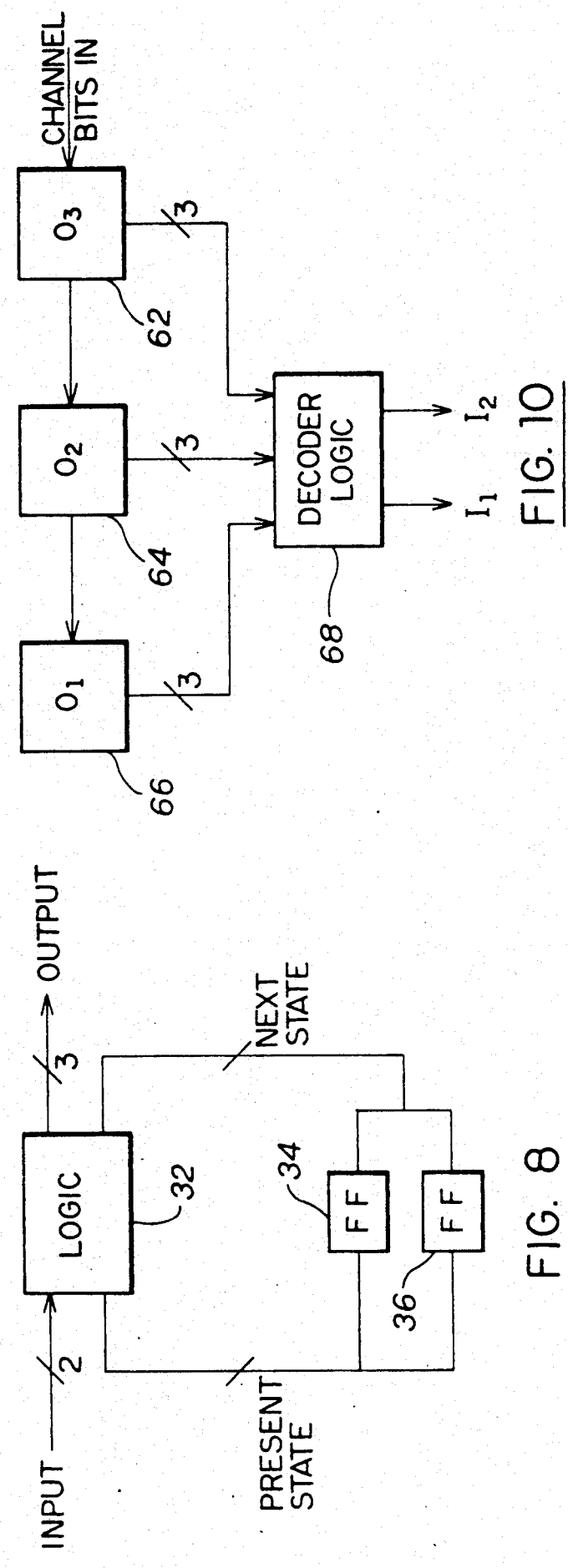
FIG. 6
FIG. 8
FIG. 10

APPARATUS UTILIZING A FOUR STATE ENCODER FOR ENCODING AND DECODING A SLIDING BLOCK (1,7) CODE

BACKGROUND OF THE INVENTION

1. Field of the Invention

This invention relates to an encoding and decoding apparatus for use with a magnetic recording channel, and in particular, to a run length limited (1,7) encoding and decoding apparatus that maps 2 unconstrained bits into 3 constrained bits.

2. Description Relative to the Prior Art

Run length limited codes, generically designated as (d,k) codes, have been widely and successfully applied in modern magnetic recording systems. They are extensions of earlier non return to zero recording codes, where binarily recorded "zeros" are represented by no flux change in the magnetic medium, while binary "ones" are represented by transitions from one direction of recorded flux to the opposite direction. In a (d,k) code, the above recording rules are maintained with the additional constraints that at least d "zeros" are recorded between successive data "ones", and no more than k "zeros" are recorded between successive data "ones". The first constraint arises to obviate intersymbol interference occurring due to pulse crowding of the reproduced transitions when a series of "ones" are contiguously recorded. The second constraint arises in recovering a clock from the reproduced data by "locking" a phase locked loop to the reproduced transitions. If there is too long an unbroken string of contiguous "zeros" with no interspersed "one" transitions, the clock generating Phase locked loop will fall out of synchronism. In a (1,7) code there is at least one "zero" inserted between the recorded "ones", and there are no more than seven recorded contiguous "zeros" between recorded "ones".

The "rate" of the code is a parameter which is a measure of its efficiency. The theoretical maximum rate of a code is called the Shannon capacity, and for a (1,7) code it has a value of 0.679. The implementation of practical codes requires that the rate be a rational fraction, and the code of the present invention is a rate $\frac{2}{3}$ (1,7) code. This $\frac{2}{3}$ rate, i.e. 0.667, is slightly less than the Shannon capacity, and the code is a therefore a highly efficient one. To achieve the $\frac{2}{3}$ rate, 2 unconstrained data bits are mapped into 3 constrained encoded bits.

Rate $\frac{2}{3}$ sliding block (1,7) codes and means for implementing associated encoders and decoders are known in the art. U.S. Pat. No. 4,413,251 entitled "Method and Apparatus for Generating A Noiseless Sliding Block Code for a (1,7) Channel with Rate $\frac{2}{3}$", issued in the names of Adler et al, discloses an encoder which is a finite state machine having 5 internal states whose description requires 3 bits. Error propagation of Adler et al's (1,7) code does not exceed 5 data bits. U.S. Pat. No. 4,488,142 entitled "Apparatus for Encoding Unconstrained Data onto a (1,7) Format with Rate $\frac{2}{3}$", issued in the name of Franaszek discloses an encoder having 8 internal states whose description also requires 3 bits. Franaszek's encoding technique utilizes "look ahead" at the upcoming data bits in the encoding of the current data bits, and error Propagation is 4 bits in bursts of 5.

The (1,7) codes of the above prior art are block codes, that is, the output codes are all of fixed length equal to 3 constrained bits. While the explicit mapping rules differ, and hardware implementation of the codes by means of encoders and decoders differ, each of the above block codes meets the conditions required of (1,7) codes with rate $\frac{2}{3}$.

SUMMARY OF THE INVENTION

The present invention comprises the hardware implementation of an algorithm for a run length limited (1,7) sliding block code of rate $\frac{2}{3}$, wherein 2 unconstrained bits are mapped onto 3 constrained bits. The encoded data stream has a minimum of 1 "zero" between adjacent "ones", and a maximum of seven "zeros" between adjacent "ones". Unlike earlier (1,7) sliding block encoders, the encoder of the present invention is a 4 state machine whose internal state description requires only 2 bits, rather than the 3 bits as taught in the prior art. The 4 state encoder combines the 2 incoming data bits with present state information to generate the output encoded sequence, and the next state designation. Error propagation due to a single channel bit error is limited to 5 bits.

The decoder of the invention utilizes three adjacently connected, 3 bit shift registers which hold 9 contiguous bits of the encoded data. The 9 bits are applied "broadside" to a logic circuit which derives the decoded 2 bit values of the three bits in the first register. The 3 bits of the first register are then shifted out, the 3 bits in the second register are shifted into the first register, and the contents of the third register are shifted into the second register. Three new encoded bits are shifted into the third register, and the decoding operation is repeated.

BRIEF DESCRIPTION OF THE DRAWINGS

FIG. 6 is a block diagram of a magnetic recording channel utilizing a (1,7) encoder and decoder, FIG. 8 is a block diagram for a further understanding of the encoder of the invention, FIG. 10 is a block diagram of the decoder of the invention.

DESCRIPTION OF A PREFERRED EMBODIMENT

Figure 1:
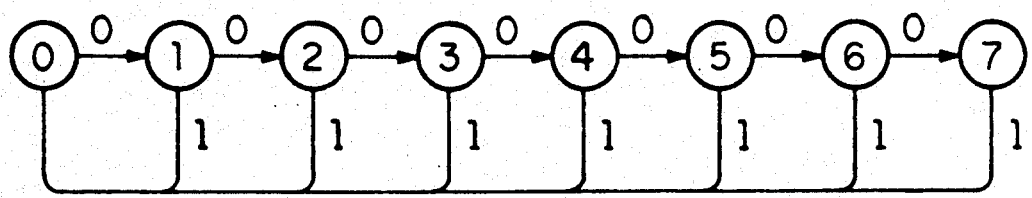
FIG. 1 is a constraint graph of the (1,7) run length limited code.
Figure 2:
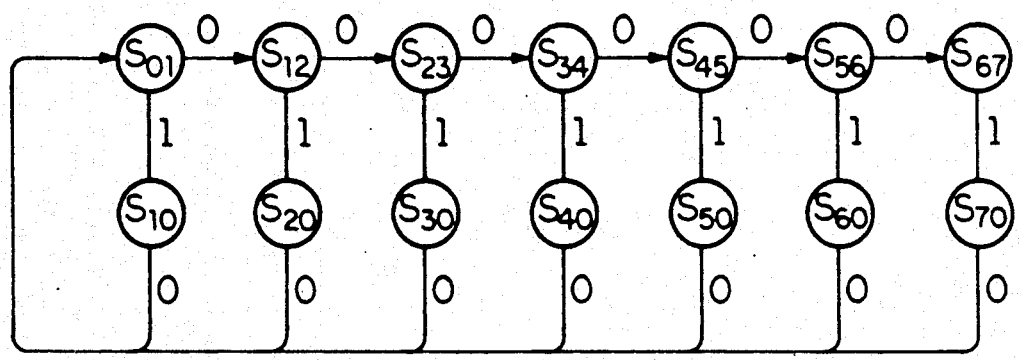
FIG. 2 is a second order edge graph containing the same constraints as FIG. 1.

Before providing a detailed description of an embodiment of the invention, the mathematical background of the state diagram on which the invention is based, will be presented. Referring to FIG. 1, the general (1,7) constraint graph, which is capable of generating any code satisfying the (1,7) constraint, is shown. The constrained paths of FIG. 1 are also represented in FIG. 2, and the (1,7) code of the present invention will be derived by imbedding additional incidental constraints on the paths of the graph of FIG. 2. These incidental constraints reduce the rate of the code from the theoretical value of 0.679 to the rational value of ⅔ required for construction of a practical code. The graph of FIG. 2 has the advantage of guaranteeing that each state will have the same output label on all incoming branches when the constraint graph is raised to the third power, as will be further explained below. Also, the process of imposing the incidental constraints will involve discarding states rather than discarding the branches between states.

Figure 3:
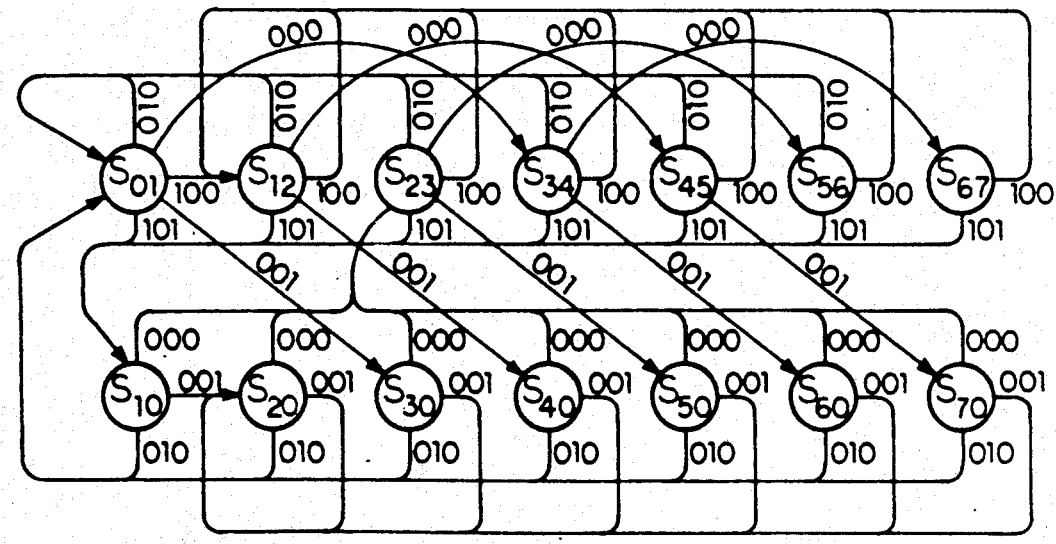
FIG. 3 is a graph of the third power of the edge graph of FIG. 2.

The graph of FIG. 2 is now raised to the third power to arrive at a new graph with output labels of length 3 corresponding to 3 constrained bits being encoded. Raising the graph to the third power entails tracing all paths in FIG. 2 which result in 3 bit sequences, and noting the originating state, the 3 bit sequence, and the final state. This information is exhibited in FIG. 3. For example, referring to FIG. 2, and starting at state $S_{01}$, the sequence 100 leads from $S_{01}$ to $S_{10}$ back to $S_{01}$ then to the final state $S_{12}$. In FIG. 3, this output is seen as a directed line originating at state $S_{01}$, terminating on state $S_{12}$ and labelled 100. The incidental constraints are imposed by discarding states $S_{60}$, $S_{67}$, $S_{70}$ and the resulting graph has a rate equal to ⅔.

The resulting new constraint graph may be represented as a transition table as shown in Table 1.

TABLE 1

| Initial State | Final States and Output Edge Label | | | | |
|---|---|---|---|---|---|
| $S_{01}$ | $S_{01}$,010 | $S_{10}$,101 | $S_{12}$,100 | $S_{30}$,001 | $S_{34}$,000 |
| $S_{10}$ | $S_{01}$,010 | $S_{20}$,001 | $S_{23}$,000 | | |
| $S_{12}$ | $S_{01}$,010 | $S_{10}$,101 | $S_{12}$,100 | $S_{30}$,001 | $S_{34}$,000 |
| $S_{20}$ | $S_{01}$,010 | $S_{20}$,001 | $S_{23}$,000 | | |
| $S_{23}$ | $S_{01}$,010 | $S_{10}$,101 | $S_{12}$,100 | $S_{30}$,001 | $S_{34}$,000 |
| $S_{30}$ | $S_{01}$,010 | $S_{20}$,001 | $S_{23}$,000 | | |
| $S_{34}$ | $S_{01}$,010 | $S_{10}$,101 | $S_{12}$,100 | | |
| $S_{40}$ | $S_{01}$,010 | $S_{20}$,001 | $S_{23}$,000 | | |
| $S_{45}$ | $S_{01}$,010 | $S_{10}$,101 | $S_{12}$,100 | | |
| $S_{50}$ | $S_{01}$,010 | $S_{20}$,001 | $S_{23}$,000 | | |
| $S_{56}$ | $S_{01}$,010 | $S_{10}$,101 | $S_{12}$,100 | | |

The information of Table 1 may be condensed into a table of equivalent states, Table 2, where each equivalent state, relabelled a,b,c, is comprised of those states of Table 1 which all go to the same next state, with the same output.

TABLE 2

| Relabelled Input State | Equivalent States |
|---|---|
| a | $S_{10}$,$S_{20}$,$S_{30}$,$S_{40}$,$S_{50}$ |
| b | $S_{34}$,$S_{45}$,$S_{56}$ |
| c | $S_{01}$,$S_{12}$,$S_{23}$ |

The transition table, Table 1, may be restated in terms of these equivalent states in table 3. In Table 3, the outgoing edge labels are represented as octal numbers for compactness.

TABLE 3

| Initial State | Final State, and Output Edge Label | | | | |
|---|---|---|---|---|---|
| a | c,2 | a,1 | c,0 | | |
| b | c,2 | a,5 | c,4 | | |
| c | c,2 | a,5 | c,4 | a,1 | b,0 |

Figure 4:
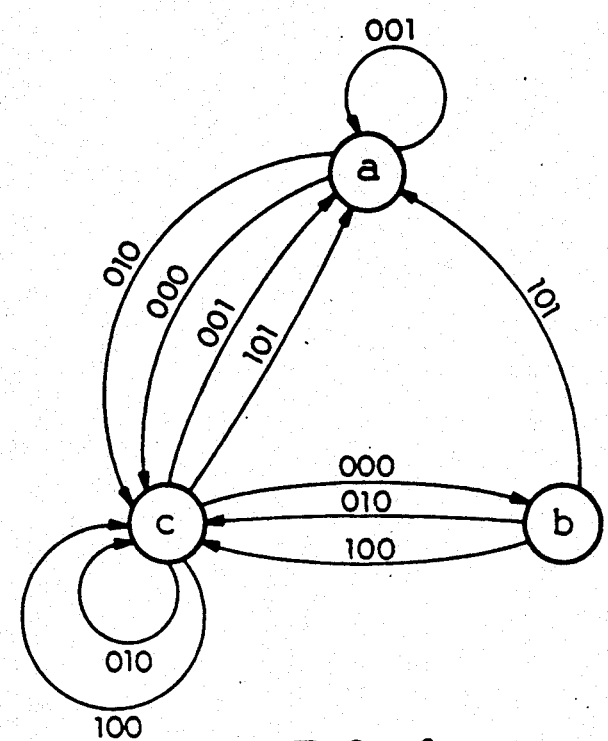
FIG. 4 is the reduced edge graph of FIG. 3 with incidental constraints.

The corresponding constraint graph is shown in FIG. 4. It will be noted that the states of FIG. 4 do not meet the requirements for generating a usable (1,7) code because each state does not have four outgoing edges corresponding to the required constrained coding of the output bits for the four combinations of two input bits.

The graph of FIG. 4 must be modified to meet this requirement to allow hardware implementation of an encoding machine. This is accomplished by applying the sliding block algorithm derived by R. L. Adler, D. Coppersmith, and M. Hassner, "Algorithms for Sliding Block Codes", IEEE Transactions on Information Theory, Vol. II-29, No. 1, January 1983, pp. 5–22 to the graph of FIG. 4. This graph has the transition matrix, T, and an approximate eigenvector, v, shown below.

$$T = \begin{matrix} 102 \\ 102 \\ 212 \end{matrix} \quad v = \begin{matrix} 2 \\ 2 \\ 3 \end{matrix}$$

The approximate eigenvector has a weight equal to 7, so the encoding machine before reduction will have 7 states. The successor table is shown in Table 4. The notation which is used to represent the successors has the general form $a^{i..j;k}$. With this notation, k is the octal representation of the outgoing edge label associated with the transition, and i..j represents that this state will eventually be split into j-i+1 states labelled $a^i, a^{i+1}, \ldots a^j$.

TABLE 4

| $a^{1..2}$ | ; | $c^{1..3;0}$ | $c^{1..3;2}$ | $a^{1..2;1}$ | | |
|---|---|---|---|---|---|---|
| $b^{1..2}$ | ; | $c^{1..3;4}$ | $c^{1..3;2}$ | $a^{1..2;5}$ | | |
| $c^{1..3}$ | ; | $c^{1..3;4}$ | $c^{1..3;2}$ | $a^{1..2;5}$ | $a^{1..2;1}$ | $b^{1..2;0}$ |

Table 4 is next partitioned as shown in Table 5, below.

TABLE 5

| $a^{1..2}$ | ; | $[c^{1..3;0},$ | $c^{1..3;2},$ | $a^{1..2;1}]$ | | |
|---|---|---|---|---|---|---|
| $b^{1..2}$ | ; | $[c^{1..3;4},$ | $c^{1..3;2},$ | $a^{1..2;5}]$ | | |
| $c^{1..3}$ | ; | $[c^{1..3;4},$ | $c^{1..3;2},$ | $a^{1..2;5}],$ | $[a^{1..2;1},$ | $b^{1..2;0}]$ |

The entries of Table 5 are next split as shown in Table 6, below.

TABLE 6

| $a^{1..2}$ | ; | $c^{1..2;0},$ | $c^{3;0},$ | $c^{1..2;2},$ | $c^{3;2},$ | $a^{1..2;1}$ |
|---|---|---|---|---|---|---|
| $b^{1..2}$ | ; | $c^{1..2;4},$ | $c^{3;4},$ | $c^{1..2;2},$ | $c^{3;2},$ | $a^{1..2;5}$ |
| $c^{1..2}$ | ; | $c^{1..2;4},$ | $c^{3;4},$ | $c^{1..2;2},$ | $c^{3;2},$ | $a^{1..2;5}$ |
| $c^3$ | ; | $a^{1..2;1},$ | $b^{1..2;0}$ | | | |

Table 6 is then further partitioned as shown in Table 7, below.

TABLE 7

| $a^{1..2}$ | ; | $[c^{1..2;0},$ | $a^{1..2;1}]$ | $[c^{3;0},$ | $c^{1..2;2},$ | $c^{3;2}]$ |
|---|---|---|---|---|---|---|
| $b^{1..2}$ | ; | $[c^{1..2;4},$ | $a^{1..2;5}]$ | $[c^{3;4},$ | $c^{1..2;2},$ | $c^{3;2}]$ |
| $c^{1..2}$ | ; | $[c^{1..2;4},$ | $a^{1..2;5}]$ | $[c^{3;4},$ | $c^{1..2;2},$ | $c^{3;2}]$ |
| $c^3$ | ; | $[a^{1..2;1},$ | $b^{1..2;0}]$ | | | |

The entries of Table 7 are split again, resulting in Table 8, below.

TABLE 8

| $a^1$ | ; | $c^{1;0}$ | $c^{2;0}$ | $a^{1;1}$ | $a^{2;1}$ |
|---|---|---|---|---|---|
| $a^2$ | ; | $c^{3;0}$ | $c^{1;2}$ | $c^{2;2}$ | $c^{3;2}$ |
| $b^1$ | ; | $c^{1;4}$ | $c^{2;4}$ | $a^{1;5}$ | $a^{2;5}$ |
| $b^2$ | ; | $c^{3;4}$ | $c^{1;2}$ | $c^{2;2}$ | $c^{3;2}$ |
| $c^1$ | ; | $c^{1;4}$ | $c^{2;4}$ | $a^{1;5}$ | $a^{2;5}$ |
| $c^2$ | ; | $c^{3;4}$ | $c^{1;2}$ | $c^{2;2}$ | $c^{3;2}$ |
| $c^3$ | ; | $b^{1;0}$ | $b^{2;0}$ | $a^{1;1}$ | $a^{2;1}$ |

Of the 7 states listed as the row labels in Table 8, only 4 states are unique; for example, states $b^2$ and $c^2$ are identical. The unique states, relabelled as states 1,2,3,4, are shown in Table 9, along with the equivalent states comprising them.

TABLE 9

| 1 | ; | $b^2$ | $c^2$ |
|---|---|---|---|
| 2 | ; | $b^1$ | $c^1$ |
| 3 | ; | $a^1$ | $c^3$ |
| 4 | ; | $a^2$ | |

Figure 5:
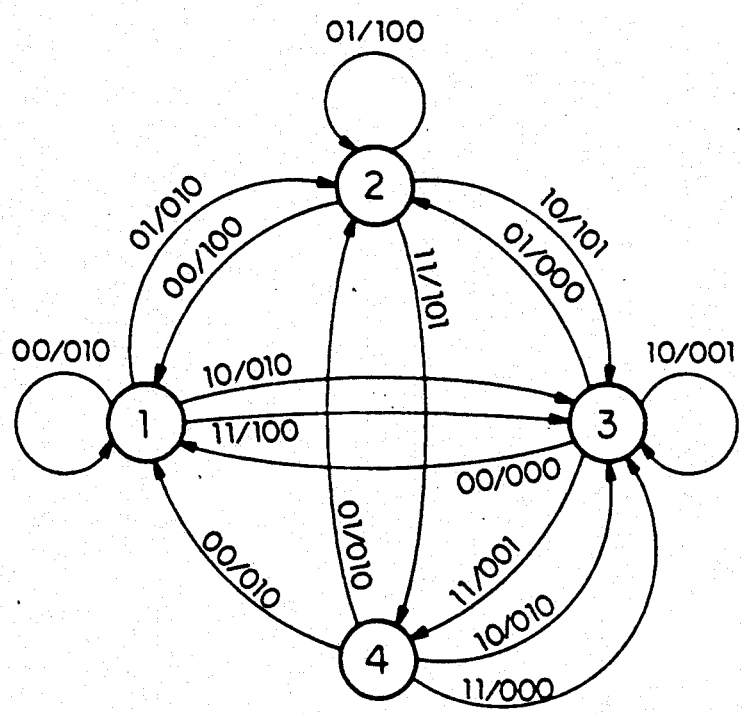
FIG. 5 is the transition graph of the encoder of the present invention.

The state diagram of the encoder utilizing the information of Table 9 is shown in FIG. 5. Note that each state has four outgoing edges labelled with 3 bit constrained output codes, and each edge has an arbitrarily assigned unconstrained 2 bit input combination.

Table 10 contains the same information as FIG. 5 arranged in tabular form. An entry in the table consists of the next state designation, separated by a ",", from the constrained output code, where the column heading is the unconstrained input combination of 2 bits, and the row heading is the initial encoder state. For example, if the initial state is state 2 and the unconstrained input is 10, the next state is state 3 and the constrained output bits are 101.

TABLE 10

| STATE | INPUT BITS | | | |
|---|---|---|---|---|
| | 00 | 01 | 10 | 11 |
| 1 | 1,010 | 2,010 | 3,010 | 3,100 |
| 2 | 1,100 | 2,100 | 3,101 | 4,101 |
| 3 | 1,000 | 2,000 | 3,001 | 4,001 |
| 4 | 1,010 | 2,010 | 3,010 | 3,000 |

With the above mathematical background in mind, the hardware implementation of a preferred embodiment of the invention may now be developed. Referring to FIG. 6, a digital source 10 feeds sequences of two unconstrained bits to an encoder 12, which correspondingly outputs 3 constrained bits to a magnetic tape channel 14 for storage. In recovery of the data, a magnetic playback channel 16 outputs the reproduced bits to a decoder 18 which recovers the original data. While FIG. 6 shows the encoder 12 and decoder 18 in combination with a magnetic storage channel 14,16, it will be appreciated that they may be used with other appropriate storage systems or transmission channels.

Figure 7:
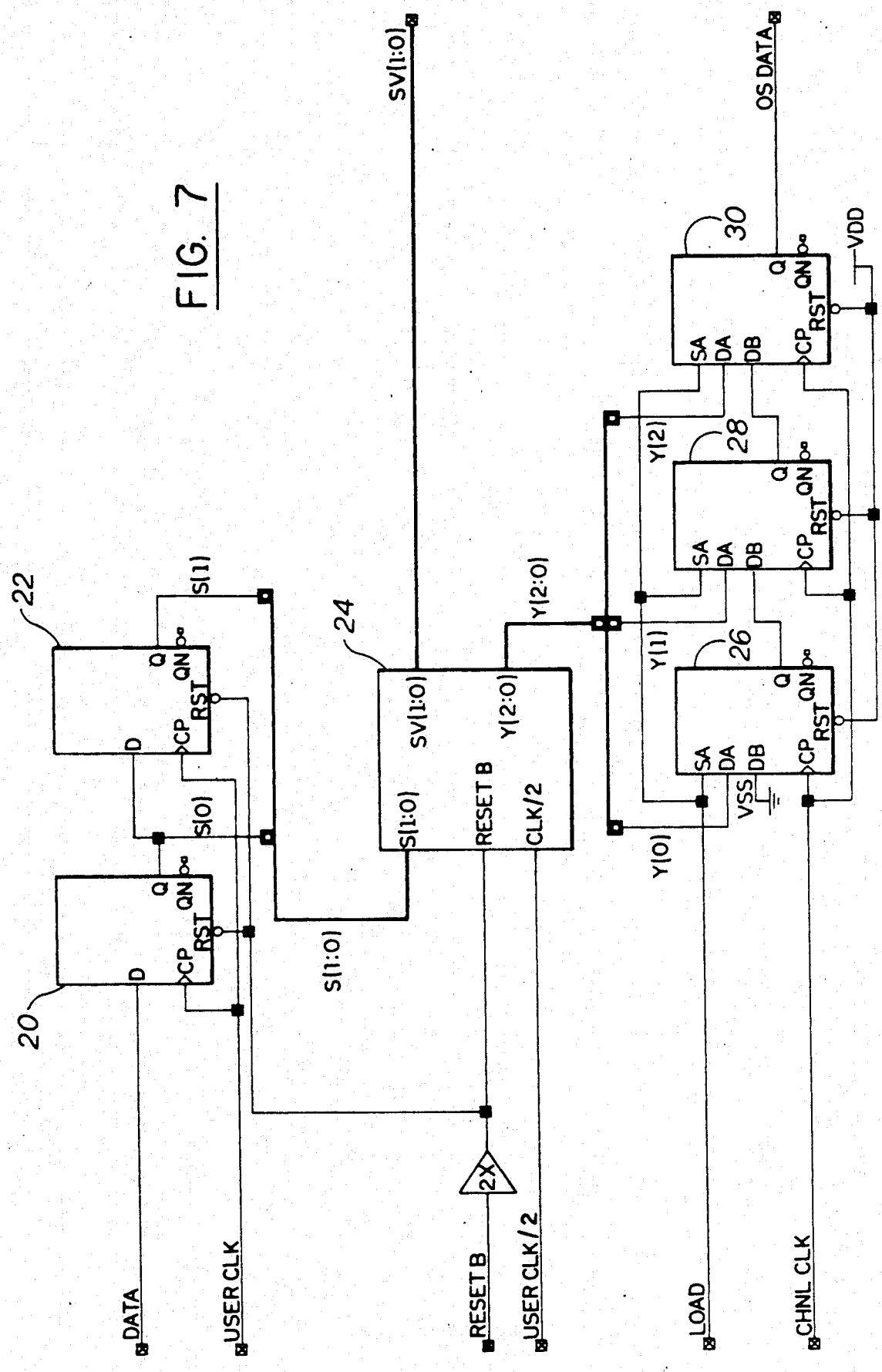
FIG. 7 is a block diagram of the encoder of the invention.

The structure of the encoder 12 is shown in block diagram FIG. 7, where the two unconstrained data bits are shifted into the encoder 12 by means of two input flip-flops 20,22. Flip-flops 20,22 then feed the input bits into logic and storage circuit 24 which generates the 3 constrained encoded bits and stores the "next state" information, as will be explained below. The encoded 3 bit output of circuits 24 are next transferred to a shift register comprised of elements 26, 28, 30 whose parallel inputs 0, $Y_1$, $Y_2$ are, respectively, the 3 constrained bit outputs of the encoder 12.

FIG. 8 shows the logic and storage circuits 24 in block diagram. The 2 input bits are fed to logic circuit 32. Recalling that the encoder 12 status is specified by four states, the "next state" information is stored in two flip-flops 34,36, whose outputs indicate the "present state" for use on the next cycle in encoding the following two input data bits.

Figure 9:
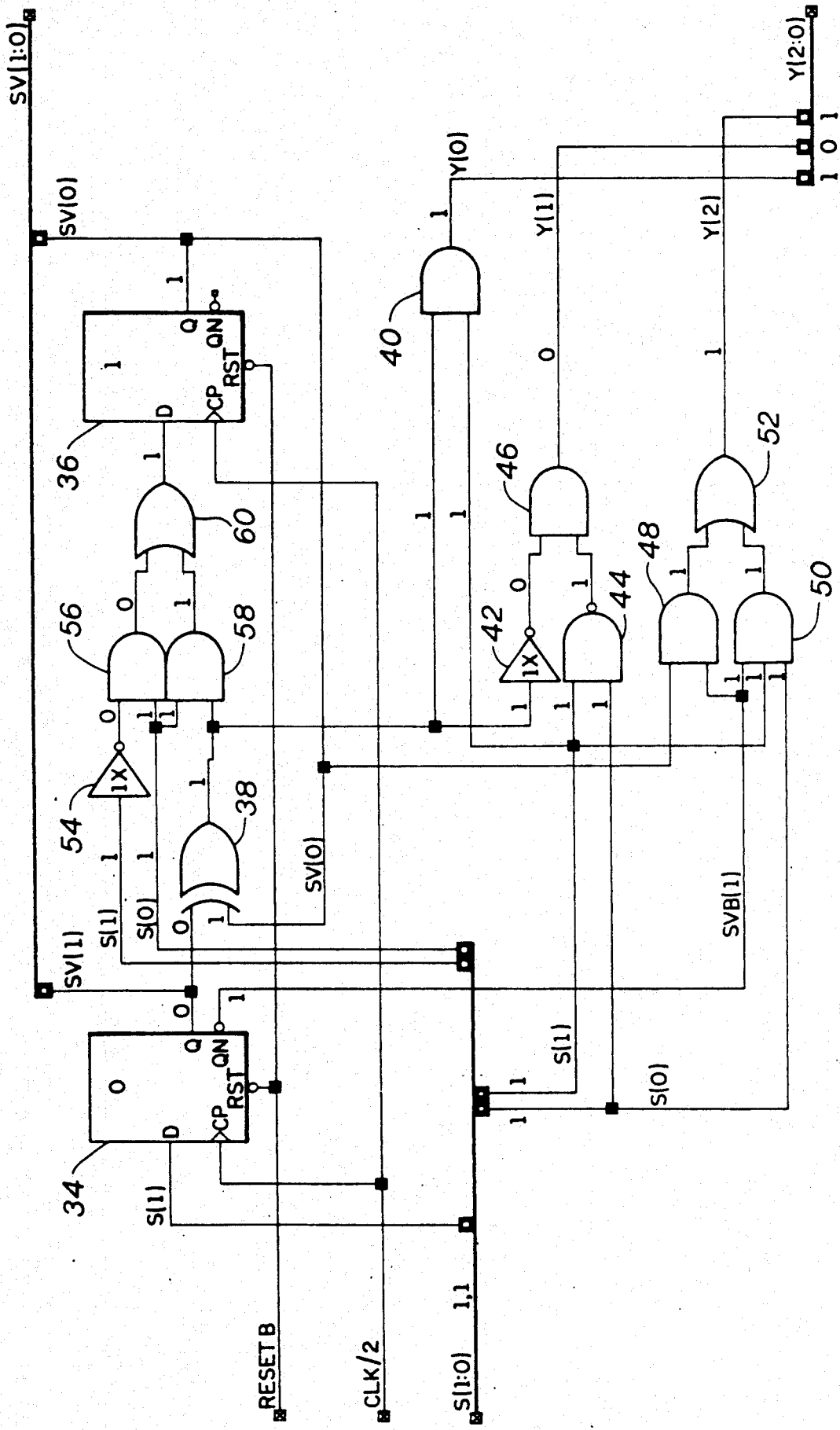
FIG. 9 is a schematic diagram of the block diagram of FIG. 8.

Referring to FIG. 9, the flip-flops 34,36, as previously stated, indicate the "present state" of the encoder. By way of example, assuming flip-flop 34 contains a "zero" and flip-flop 36 contains a "one". The states 1 through 4 of Table 10 are coded on the flip-flops (FF) 34,36 in the present embodiment, in accordance with Table 10, as follows:

TABLE 11

| STATE | FF34 | FF36 |
|---|---|---|
| 1 | 0 | 0 |
| 2 | 0 | 1 |
| 3 | 1 | 0 |
| 4 | 1 | 1 |

The "present state" of the example is, therefore, state 2, and the Q output of FF34 is 0 and the Q output of FF36 is 1. Assuming further that the input data is 11, the inputs and outputs of the logic gates of the figure are as follows: "exclusive or" gate 38 inputs 0,1 with an output of 1; "and" gate 40 inputs 1,1 with output 1;inverting amplifier 42 input 1 with output 0:"and" gate 44 inputs 1,1 with output 1; "and" gate 46 inputs 0,1 with output 0; "and" gate 48 inputs 1,1 with output 1; "and" gate 50 inputs 1,1,1 with output 1; "or" gate 52 inputs 1,1 with output 1. The outputs of the gates 40,46,52 are respectively the coded outputs Y0,Y1,Y2 of the encoder; which are for the present example, 101. After the encoded outputs Y0,Y1,Y2 are generated, the states of FF34 and FF36 are changed under control of the "clk/2" signal. The "clk/2" is a clock signal timed so that the output code of the encoder is generated before the transfer of FF 34 and FF36 from the "present state" to the "next state" conditions. Prior to the appropriate "clk/2" signal, the D input to FF 34 is a 1 provided by input bit storage FF 22 (FIG. 7). The D input of the FF36 is derived as follows: inverting amplifier 54 has a 1 input with a 0 output; "and" gate 56 input 0,1 with output 0; "and" gate 58 input 1,1 with output 1; "or" gate 60 with input 0,1 and output 1, feeds the D input of the FF36. Under control of the "clk/2" signal, FF34 changes to a 1 state, while FF36 remains in the 1 state, since both their D inputs are 1. The next state of the encoder is, therefore, 11 and the complete output of the encoder is: "next state" 11, i.e. state 4 and present output 101. In this typical example, the encoder 12, having been in state 2 and receiving an input 11 it is seen to operate as the (1,7) state machine developed above whose input/output/state transitions are shown in Table 10 or FIG. 5.

The decoder comprises three coupled shift registers $O_1$, $O_2$, $O_3$ each holding 3 bits of the channel bit stream which is shifted through $O_3$ to $O_2$ to $O_1$, as shown in FIG. 10. The shift registers $O_1$, $O_2$, $O_3$ are conventional shift registers known to those skilled in the art. Both positive and inverted values of the 3 bits present in each of the shift registers, $O_1$, $O_2$, $O_3$ are available, and are fed to the decoder logic to derive the 2 original input bits as outputs $I_1, I_2$.

In decoding, the current output symbol along with the following 2 output symbols is used to uniquely determine the input. The mapping between the channel output and the data input is given by the following Boolean expressions.

$I_1 = 00x + 01x + 1xx + 20x + 21x + 40x + 41x + 5xx$ $I_2 = 042 + 044 + 045 + 05x + 101 + 100 + 242 + 244 +$ $245 + 25x + 40x + 41x + 442 + 444 + 445 + 45x + 500 +$ $501 + 52x + 12x + 00x + 01x$

-continued x — don't care

These equations are interpreted as follows. The 3 digit octal numbers represent the channel output symbols for which the corresponding decoded user bit is a 1, i.e. $I_1$ or $I_2$ is equal to a 1. For example, the octal number 501 means that the 3 bit register $O_1$ contains the bit pattern 101, the register $O_2$ contains the bit pattern 000, and the register $O_3$ contains the bit pattern 001. If this pattern were read from the channel, the decoded input symbol would be $(I_1, I_2) = (1,1)$, because a 501 appears explicitly in the equation for $I_2$, and implicitly in the equation of $I_1$ in the form of 5xx. The "don't cares" mean that only the first digit is needed for a match. With the structure of the decoder, a single channel bit error can affect the decoding of 3 input symbols or 6 user bits. However, because the first bit of each input symbol does not depend on $O_3$, only 5 bits can be affected by a single channel bit error.

Figure 11:
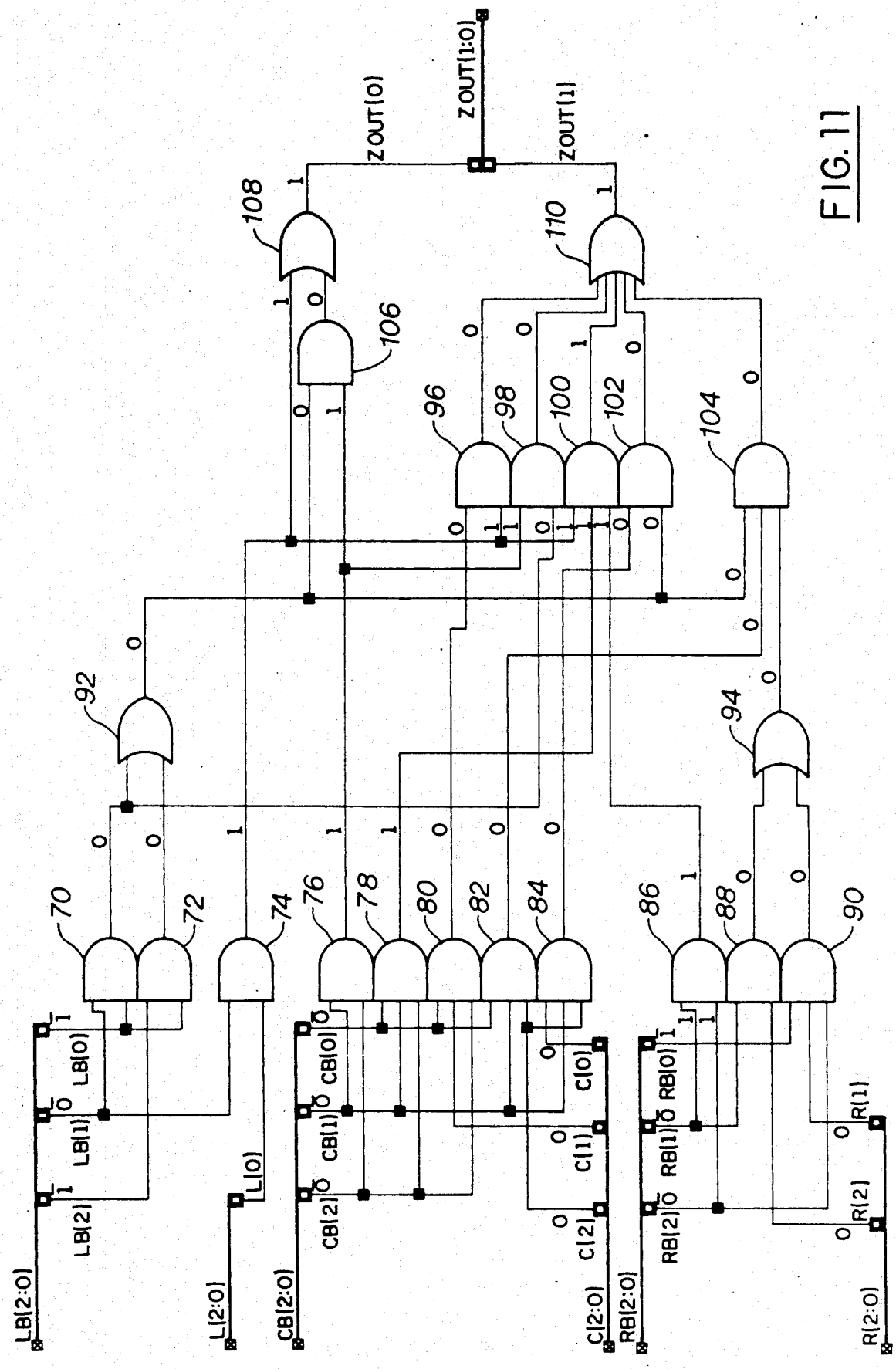
FIG. 11 is a schematic diagram of the decoder logic of the invention.

As a typical example of decoder operation, the above discussed channel symbols, 501, are applied to the decoder logic of FIG. 11. Register $O_1$ contains 101, $O_2$ contains 000 and $O_3$ contains 001, and these patterns are fed to the decoder in combinations of positive and/or inverted form, simplifying the decoder logic hardware implementation. The input designations of FIG. 11 may be understood with reference to the three registers $O_3, 62, O_2, 64, O_6hd 1, 66$ of FIG. 10. Register $O_1$, 66, is the leftmost register of FIG. 10, and the positive signals it feeds to the logic circuits of FIG. 11 appear on the bus L(2:0), while its inverted or "barred" output signals appear on the bus LB(2:0). A similar convention is used to designate the outputs of register $O_2$, 64, the center register and $O_3$, 62 the rightmost register, as seen in FIG. 10. For example, the output of register $O_3$ is applied to "and" gates 86,88,90 as "barred 0", "barred 0", "barred 1", where "barred z" is the inverted value of the bit z, as well as two of the bits also being applied in positive form, i.e., 0,0. Positive bit 1 applied to the "and" gate 74 and inverted bit barred 0 applied to the "and" gate 74 provide a 1 output which is fed to one input of the "or" gate 108 whose output 1 is the low order decoded bit of value 1. The output of the "and" gate 74 also provides a 1 as one input to the "and" gate 100. The three barred 0 inputs to the three input "and" gate 78 provide a 1 output which feeds another input of the "and" gate 100 with a 1. The two barred 0 inputs to the "and" gate 86 provide a 1 output which feeds the third input of the "and" gate 100, resulting in a 1 output of the gate 100. This output feeds a 1 through the "or" gate 110 whose output is the high order output bit of the decoded two bits, providing a 1 in accordance with the Boolean expressions above. Other channel symbols are similarly decoded by the logic circuit of FIG. 11 to provide encoded outputs in accordance with the above expressions.

The encoder and decoder circuits of FIGS. 7,9,11 were implemented on a EPM 5128 chip manufactured by the Altera Corporation, Santa Clara, Calif.

The invention has been described in detail with particular reference to preferred embodiments thereof, but it will be understood that variations and modifications can be effected within the spirit and scope of the invention.

What is claimed is:

1. An encoder/decoder system for encoding and decoding a run length limited code in accordance with the rule specifying a minimum of one and a maximum of seven 0's between adjacent ones, with a coding rate of ⅔, said encoder/ decoder system comprising:

a. an encoder comprising means for receiving 2 input data bits,
   b. storage means for storing 2 present encoder state defining bits, said 2 present encoder state defining bits being derived from the immediately preceding encoding operation, and
   c. first logic circuit means for logically combining said 2 input data bits and said 2 present encoder state defining bits to produce 3 encoded output bits in accordance with said run length limited rules and to produce 2 next encoder state defining bits for storage in said storage means, in accordance with the following table:

| INPUT BITS | | 00 | 01 | 10 | 11 |
|---|---|---|---|---|---|
| PRESENT | 1 | 1,010 | 2,010 | 3,010 | 3,100 |
| STATE | 2 | 1,100 | 2,100 | 3,101 | 4,101 |
| | 3 | 1,000 | 2,000 | 3,001 | 4,001 |
| | 4 | 1,010 | 2,010 | 3,010 | 3,000 |

LEGEND
State: 1=00, 2=01, 3=10, 4=11 Leftmost bit=MSB
Input Bits: 00, 01, 10, 11 Leftmost bit=MSB
Table Entry: W,XYZ
W=Next State
XYZ= 3 Output Bits; X=MSB d. a decoder comprising a second logic circuit for decoding encoded bits, said second logic circuit having an output of 2 decoded bits for each of 3 of said encoded bits presented to said decoder in groups 3, in accordance with the following Boolean expressions:

$I_1 = 00x + 01x + 1xx +$
$20x + 21x + 40x + 41x +$
$5xx$
$I_2 = 042 + 044 + 045 + 05x$
$+ 101 + 100 + 242 + 244 + 245$
$+ 25x + 40x + 41x + 442 +$
$444 + 445 + 45x + 500 + 501$
$+ 52x + 12x + 00x + 01x$

LEGEND
$I_1 = MSB$ of decoded two bits
$I_2 = LSB$ of decoded two bits

Equation terms: ABC; Octal representation of 9 bits presented to said decoder in groups of 3, A=first group of 3 presented, B=second group of 3 presented, C=third group of 3 presented, x=don't care.

2. An encoder for generating a run length limited code in accordance with the rule specifying a minimum of one and a maximum of seven 0's between adjacent ones, with a coding rate of ⅔, said encoder comprising:

a. means for receiving 2 input data bits,
   b. storage means for storing 2 present encoder state defining bits derived from an immediately preceding encoding operation, and
   c. logic circuit means for logically combining the 2 input data bits and the 2 present encoder state defining bits to produce 3 encoded output bits in accordance with said run length limited rules and to produce 2 next encoder state defining bits for storage in said storage means, in accordance with the following table:

| PRESENT STATE | INPUT BITS | | | |
|---|---|---|---|---|
| | 00 | 01 | 10 | 11 |
| 1 | 1,010 | 2,010 | 3,010 | 3,100 |
| 2 | 1,100 | 2,100 | 3,101 | 4,101 |
| 3 | 1,000 | 2,000 | 3,001 | 4,001 |
| 4 | 1,010 | 2,010 | 3,010 | 3,000 | wherein table entries are in the general form W, XYZ,

W being the next state, and

XYZ being the three encoded output bits, with X being the most significant bit.

* * * * *

UNITED STATES PATENT AND TRADEMARK OFFICE
CERTIFICATE OF CORRECTION

PATENT NO. : 5,047,767
DATED : September 10, 1991
INVENTOR(S) : A. D. Weathers and R. E. Swanson It is certified that error appears in the above-identified patent and that said Letters Patent is hereby corrected as shown below:

Cover page

Section [75] Inventors      "Robert D. Swanson" should be ---Robert E. Swanson---

Signed and Sealed this

Ninth Day of February, 1993

Attest:

STEPHEN G. KUNIN

*Attesting Officer*      *Acting Commissioner of Patents and Trademarks*